(12) United States Patent
Choi et al.

(10) Patent No.: US 9,778,566 B2
(45) Date of Patent: Oct. 3, 2017

(54) PHOTOCURABLE AND THERMOCURABLE RESIN COMPOSITION AND DRY FILM SOLDER RESIST

(71) Applicant: LG CHEM, LTD., Seoul (KR)

(72) Inventors: Byung Ju Choi, Daejeon (KR); You Jin Kyung, Daejeon (KR); Woo Jae Jeong, Daejeon (KR); Bo Yun Choi, Daejeon (KR); Kwang Joo Lee, Daejeon (KR); Min Su Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/925,389

(22) Filed: Oct. 28, 2015

(65) Prior Publication Data

US 2016/0116842 A1    Apr. 28, 2016

(30) Foreign Application Priority Data

Oct. 28, 2014 (KR) .................. 10-2014-0147657

(51) Int. Cl.
| | | |
|---|---|---|
| G03F 7/032 | (2006.01) | |
| G03F 7/028 | (2006.01) | |
| G03F 7/004 | (2006.01) | |
| G03F 7/027 | (2006.01) | |
| G03F 7/031 | (2006.01) | |
| G03F 7/038 | (2006.01) | |
| G03F 7/029 | (2006.01) | |

(52) U.S. Cl.
CPC ............ *G03F 7/032* (2013.01); *G03F 7/0047* (2013.01); *G03F 7/027* (2013.01); *G03F 7/028* (2013.01); *G03F 7/029* (2013.01); *G03F 7/031* (2013.01); *G03F 7/038* (2013.01)

(58) Field of Classification Search
None
See application file for complete search history.

(56) References Cited

U.S. PATENT DOCUMENTS

2014/0221519 A1*  8/2014  Ku .................. C09D 179/04
                                              522/64
2015/0191588 A1*  7/2015  Choi ................. C08K 3/04
                                              428/220

FOREIGN PATENT DOCUMENTS

| CN | 102382422 B | 1/2013 |
|---|---|---|
| JP | 6-167806 A | 6/1994 |
| JP | 2004-200534 A | 7/2004 |
| JP | 2008-258253 A | 10/2008 |
| JP | 4272012 B2 | 6/2009 |
| JP | 2009-302150 A | 12/2009 |
| JP | 2010-260902 A | 11/2010 |
| JP | 4920929 B2 | 4/2012 |
| JP | 4967353 B2 | 7/2012 |
| JP | 5089426 B2 | 12/2012 |
| JP | 5089885 B2 | 12/2012 |
| KR | 10-0830810 B1 | 5/2008 |
| KR | 10-0830945 B1 | 5/2008 |
| KR | 10-2012-0009641 A | 2/2012 |
| KR | 10-2012-0046528 A | 5/2012 |
| KR | 10-2012-0086698 A | 8/2012 |
| KR | 10-2013-0049520 A | 5/2013 |
| KR | 10-2013-0095730 A | 8/2013 |
| KR | 10-2013-0106777 A | 9/2013 |
| KR | 10-2014-0096637 A | 8/2014 |
| KR | 10-2014-0118218 A | 10/2014 |
| WO | WO 2013/125854 A1 * | 8/2013 |
| WO | WO 2014/204173 A1 * | 12/2014 |

* cited by examiner

*Primary Examiner* — Sin Lee
(74) *Attorney, Agent, or Firm* — Rothwell, Figg, Ernst & Manbeck, P.C.

(57) ABSTRACT

Provided are a photocurable and thermocurable resin composition including: an acid-modified oligomer including an iminocarbonate-based compound containing a carboxyl group and a photocurable unsaturated functional group; a photopolymerizable monomer having two or more photocurable unsaturated functional groups; a thermocurable binder having a thermally curable functional group; a functional filler including one or more selected from the group consisting of carbon allotrope particles having a ceramic compound bound to a surface thereof and heat radiating ceramic particles; and a photoinitiator, and a dry film solder resist manufactured therefrom.

23 Claims, No Drawings

PHOTOCURABLE AND THERMOCURABLE RESIN COMPOSITION AND DRY FILM SOLDER RESIST

CROSS-REFERENCE TO RELATED APPLICATION

This application claims the benefit of priority to Korean Patent Application No. 10-2014-0147657 filed in the Korean Intellectual Property Office on Oct. 28, 2014, the entire contents of which are incorporated herein by reference.

TECHNICAL FIELD OF THE INVENTION

The present invention relates to a photocurable and thermocurable resin composition, and a dry film solder resist.

BACKGROUND OF THE INVENTION

As various electronic devices are down-sized and reduced in weight, a photosensitive solder resist capable of forming a fine opening pattern is being used in a printed circuit board, a semiconductor package substrate, a flexible circuit board, and the like.

A semiconductor package product is a composite material consisting of an insulator such as epoxy molding and a solder resist, a semiconductor such as a chip die, and a conductor such as a board circuit pattern, and in order to manufacture the product, various processes involving harsh thermal impact conditions should be applied.

However, since each of the insulator, the semiconductor, and the conductor has a different coefficient of thermal expansion (CTE), dimensional instability and warpage of components are generated.

Such phenomenon generates a location mismatch between a chip and a substrate when connecting a chip die and a semiconductor substrate with a solder ball or a gold wire, and also generates cracks and breakage of the product due to shear strength, which may affect the life of the product.

As the thickness of the substrate has recently become gradually thinner, such dimensional instability or warpage has become a bigger problem.

As an effort to solve this problem, a material has been developed in a direction of minimizing the CTE mismatch between materials, and a solder resist having a lower coefficient of thermal expansion is consistently required to be developed.

A previously known dry film solder resist (DFSR) has a coefficient of thermal expansion of α1 (coefficient of thermal expansion before Tg) of 45 to 70 ppm, and α2 (coefficient of thermal expansion after Tg) of 140 to 170 ppm.

Among recent substrate materials, materials having a coefficient of thermal expansion of 10 ppm or less or 5 ppm or less have been developed as a core, however, the development of the materials of the solder resist which may be used therewith is not yet known.

Further, though an attempt has been made to lower the coefficient of thermal expansion of the solder resist by increasing the content of the filler to be used, when the content of the filler is increased above a certain level, a coating defect may occur due to aggregation of the filler, and an elongation rate may be decreased after coating before curing, thereby deteriorating workability.

The solder resist is generally required to have the characteristics such as developability, a high-resolution property, an insulating property, stickiness, soldering thermal resistance, gold plating resistance, and the like.

Particularly, the solder resist for a semiconductor package substrate is, in addition to such properties, required to have, for example, crack resistance to a temperature cycle test (TCT) of −65° C. to 150° C., or a highly accelerated stress test (HAST) property between fine wires.

In recent years, as the solder resist, a dry film solder resist having good uniformity of a film thickness, surface smoothness, and thin film formability has been drawing attention.

The dry film solder resist may have an advantage in that a process for forming the resist is simplified, or a discharged amount of a solvent in the formation of the resist is reduced, in addition to the above characteristics.

Conventionally, a photocurable and thermocurable resin composition including a photopolymerizable monomer such as multifunctional acrylate, together with an acid-modified oligomer, a photoinitiator, and a thermocurable binder, has been used for forming the solder resist.

However, the solder resist formed from the resin composition does not have a high glass transition temperature, and accordingly sufficient thermal resistance reliability, and thus does not properly meet PCT resistance, TCT heat-resistance, HAST resistance between fine wires, and the like which are required for package substrate materials of a semiconductor device.

Meanwhile, due to a recent trend of lightening, thinning, shortening, and miniaturization of electronic devices and components, an integration degree of an electrical element is being increased, and a heating value of an electrical element operating with electrical energy is being greatly increased. Accordingly, there is a growing demand for improving a heat radiation property for effectively dissipating and emitting heat generated at the inside of the electronic device. In addition, as an integration degree of an electrical element is raised, an amount of generated electromagnetic waves is also increased, and these electromagnetic waves leak through a joining portion, a connecting portion, or the like of an electronic device, which lead to harmful effects such as causing a malfunction of other electrical elements or electronic components, or weakening an immune function of a human body.

Accordingly, various researches on how to simultaneously implement a heat radiation property to effectively dissipate and emit the heat generated from an electrical element, and a property to effectively shield and absorb electromagnetic waves causing a malfunction of an electrical element and having a bad influence on a human body, have been made.

Accordingly, methods of applying materials having a heat radiation property and materials for shielding and absorbing electromagnetic waves together have been suggested. Particularly, products in which a sheet having a thermal conducting property and a sheet having an electromagnetic wave shielding/absorbing performance are stacked have been widely used, but the products were thick due to the nature of the multilayered materials, had a problem in generation of an electrical short circuit and the like, and had difficulty in implementing the thermal conductivity and the electromagnetic absorbing property to the degree recently required by electronic devices. Further, in order to improve the thermal conductivity and electromagnetic absorbing property, a method of increasing a charged amount of a filler added to the multilayered materials has been suggested, however, due to compatibility and the like, it is difficult to charge the filler above a certain amount, and when the charged amount of the filler is increased, hardness of the multilayered materials is increased, thereby reducing a thermal conducting property of the product.

SUMMARY OF THE INVENTION

The present invention has been made in an effort to provide a photocurable and thermocurable resin composition having advantages of having a lower coefficient of thermal expansion and improved thermal resistance reliability, and maintaining a magnetic property and a thermal conducting property, while simultaneously even imparting an electrical insulating property, thereby providing a dry film solder resist capable of implementing an excellent thermal conducting property and electromagnetic wave absorption performance without lowering voltage resistance strength.

Further, the present invention has been made in an effort to provide a dry film solder resist having advantages of having a lower coefficient of thermal expansion and improved thermal resistance reliability, and maintaining a magnetic property and a thermal conducting property, while simultaneously imparting an electrical insulating property, thereby implementing an excellent thermal conducting property and electromagnetic wave absorption performance without lowering voltage resistance strength.

An exemplary embodiment of the present invention provides a photocurable and thermocurable resin composition including: an acid-modified oligomer including an iminocarbonate-based compound containing a carboxyl group and a photocurable unsaturated functional group; a photopolymerizable monomer having two or more photocurable unsaturated functional groups; a thermocurable binder having a thermally curable functional group; a functional filler including one or more selected from the group consisting of carbon allotrope particles having a ceramic compound bound to a surface thereof and heat radiating ceramic particles; and a photoinitiator.

The carbon allotrope particles may include one or more selected from the group consisting of graphite, carbon nanotubes (CNT), graphene, and graphene oxide.

The carbon allotrope particles may have a largest diameter of 0.1 μm to 5 μm, or 0.5 μm to 4 μm.

The ceramic compound may include one or more selected from the group consisting of silica, alumina ($Al_2O_3$), boron nitride (BN), aluminum nitride (AlN), silicon carbide (SiC), magnesium oxide (MgO), zinc oxide (ZnO), and aluminum hydroxide ($Al(OH)_3$).

The heat radiating ceramic particles may include one or more selected from the group consisting of spherical alumina, boron nitride, ammonium nitride, silicon carbonate, and magnesium oxide.

The heat radiating ceramic particles may have a largest diameter of 0.01 μm to 5 μm, or 0.1 μm to 4 μm.

The functional filler may include the heat radiating ceramic particles in a weight ratio of 1 to 80, 2 to 60, or 3 to 30 relative to the carbon allotrope particles having a ceramic compound bound to the surface thereof.

The functional filler may be included in an amount of 0.1 wt % to 70 wt %, based on the total weight of the resin composition.

The iminocarbonate-based compound may be formed by reacting 1) a cyanate ester-based compound, 2) a dicarboxylic acid compound, and 3) a compound having a photocurable unsaturated functional group and a hydroxyl group or a carboxyl group.

The dicarboxylic acid compound may include an aliphatic dicarboxylic acid compound, an alicyclic dicarboxylic acid compound, or an aromatic dicarboxylic acid compound.

The dicarboxylic acid compound and the compound having a photocurable unsaturated functional group and a hydroxyl group or a carboxyl group may be used in a mole ratio of 2:8 to 8:2, thereby being reacted with the cyanate ester-based compound.

The aliphatic dicarboxylic acid compound may include oxalic acid, malonic acid, succinic acid, glutaric acid, adipic acid, pimelic acid, suberic acid, azelaic acid, sebacic acid, norbornene dicarboxylic acid, tetrahydrophthalic acid, cycloalkane dicarboxylic acid having 5 to 10 carbon atoms, acid anhydrides thereof, or a mixture of two or more of those compounds.

The aromatic dicarboxylic acid compound may include phthalic acid, imidazole dicarboxylic acid, pyridine dicarboxylic acid, acid anhydrides thereof, or a mixture of two or more of those compounds.

The compound having a photocurable unsaturated functional group and a hydroxyl group or a carboxyl group may include acrylic acid, methacrylic acid, cinnamic acid, butenoic acid, hexenoic acid, 2-allylphenol, hydroxystyrene, hydroxycyclohexene, hydroxy naphthoquinone (5-hydroxyl-p-naphthoquinone), or a mixture of two or more thereof.

The cyanate ester-based compound may include a bisphenol-based or novolac-based compound having a cyanide (—OCN) group.

The acid-modified oligomer may include an iminocarbonate-based compound of the following Chemical Formula 1:

[Chemical Formula 1]

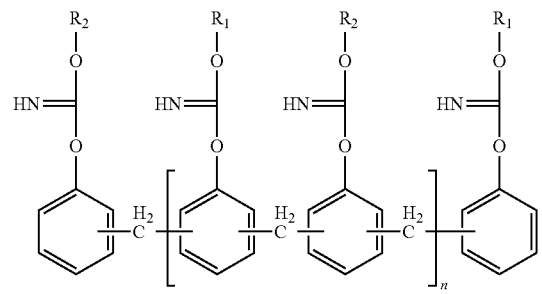

wherein n is an integer of 1 to 100; $R_1$ is a functional group derived from the compound having a photocurable unsaturated functional group and a hydroxyl group or a carboxyl group; and $R_2$ is a functional group derived from the dicarboxylic acid compound.

In Chemical Formula 1, $R_1$ may be

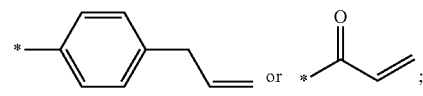

and $R_2$ may be

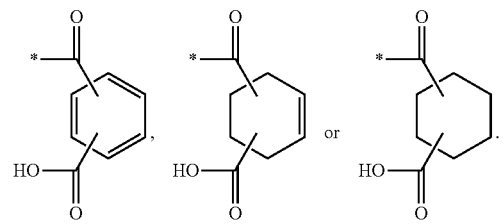

Herein, * refers to a bonding point.

The acid-modified oligomer may be included in an amount of 15 wt % to 75 wt %, based on the total weight of the resin composition.

The photopolymerizable monomer may include an acrylate-based compound having two or more photocurable unsaturated functional groups.

The photopolymerizable monomer may include a hydroxyl group-containing acrylate-based compound, a water-soluble acrylate-based compound, a polyester acrylate-based compound, a polyurethane acrylate-based compound, an epoxy acrylate-based compound, a caprolactone-modified acrylate-based compound, or a mixture of two or more thereof.

The photopolymerizable monomer may be included in an amount of 5 wt % to 30 wt %, based on the total weight of the resin composition.

The photoinitiator may include one or more selected from the group consisting of benzoin and its alkyl ethers, acetophenones, anthraquinones, thioxanthones, ketals, benzophenones, α-aminoacetophenones, acylphosphine oxides, and oxime esters.

The photoinitiator may be included at 0.5 wt % to 20 wt %, based on the total weight of the resin composition.

The thermally curable functional group may be one or more selected from the group consisting of an epoxy group, an oxetanyl group, a cyclic ether group, and a cyclic thioether group.

The thermocurable binder may be included in a content corresponding to 0.8 to 2.0 equivalents relative to 1 equivalent of the carboxyl group of the acid-modified oligomer.

The photocurable and thermocurable resin composition may further include: a solvent; and one or more selected from the group consisting of a thermocurable binder catalyst, a filler, a pigment, and an additive.

Another embodiment of the present invention provides a dry film solder resist including: a cured product of an acid-modified oligomer including an iminocarbonate-based compound containing a carboxyl group and a photocurable unsaturated functional group, a photopolymerizable monomer having two or more photocurable unsaturated functional groups, and a thermocurable binder having a thermally curable functional group; and a functional filler dispersed in the cured product and including one or more selected from the group consisting of carbon allotrope particles having a ceramic compound bound to a surface thereof and heat radiating ceramic particles.

The dry film solder resist may have thermal conductivity of 0.2 W/mK to 3.5 W/mK.

The dry film solder resist may have insulation resistance according to an IPC standard of $10*10^{11}\Omega$ or less, or $0.5*10^{11}\Omega$ to $10*10^{11}\Omega$.

The dry film solder resist may have a coefficient of thermal expansion (a1) before a glass transition temperature (Tg) of 10 to 35 ppm, and a coefficient of thermal expansion (α2) after a glass transition temperature (Tg) of 150 ppm or less.

The dry film solder resist may have a glass transition temperature (Tg) of 100° C. to 180° C.

The functional filler may be included in an amount of 0.1 wt % to 70 wt %, based on the total weight of the dry film solder resist.

The functional filler may include the heat radiating ceramic particles in a weight ratio of 1 to 80 relative to the carbon allotrope particles having a ceramic compound bound to the surface thereof.

In the dry film solder resist (DFSR), the cured product may include: a crosslinked structure in which the carboxyl group of the iminocarbonate-based compound and the thermally curable functional group are crosslinked; a crosslinked structure in which the unsaturated functional groups of the iminocarbonate-based compound and the photopolymerizable monomer are crosslinked to each other; and a triazine crosslinked structure of the following Chemical Formula 2 derived from the iminocarbonate-based compound.

[Chemical Formula 2]

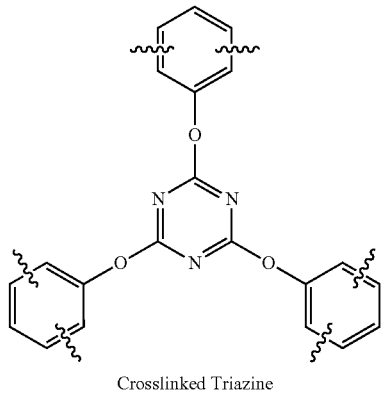

Crosslinked Triazine

As the triazine crosslinked structure represented by the above Chemical Formula 2 and the like is included, the dry film solder resist (DFSR) provided from the resin composition may have a higher glass transition temperature (Tg) and a lower coefficient of thermal expansion than a conventional structure using the acid-modified epoxy acrylate based on a novolac structure, and accordingly, may represent improved thermal resistance reliability. In Chemical Formula 2, a broken line represented by "⁓⁓⁓" refers to omission of a part of the structure of Chemical formula 2.

Therefore, the DFSR may satisfy overall physical properties such as PCT resistance, TCT resistance, and HAST resistance between fine wires which are required for the substrate materials of a semiconductor device, and also reduce warpage, thereby reducing defects and increasing life of the product.

The dry film solder resist may further include a photoinitiator dispersed in the cured product.

The dry film solder resist may be used in the manufacture of a package substrate of a semiconductor device.

According to the present invention, there may be provided a dry film solder resist capable of having a lower coefficient of thermal expansion and improved thermal resistance reliability, and maintaining a magnetic property and a thermal conducting property, while simultaneously imparting an electrical insulating property, thereby implementing an excellent thermal conducting property and electromagnetic wave absorption performance without lowering voltage resistance strength, and a photocurable and thermocurable resin composition capable of providing the dry film solder resist.

DETAILED DESCRIPTION OF THE INVENTION

Hereinafter, a photocurable and thermocurable resin composition according to an exemplary embodiment of the present invention, and DFSR, will be described in detail.

According to an embodiment of the present invention, a photocurable and thermocurable resin composition including: an acid-modified oligomer including an iminocarbonate-based compound containing a carboxyl group and a photocurable unsaturated functional group; a photopolymerizable monomer having two or more photocurable unsaturated functional groups; a thermocurable binder having a thermally curable functional group; a functional filler including one or more selected from the group consisting of carbon allotrope particles having a ceramic compound bound to a surface thereof and heat radiating ceramic particles; and a photoinitiator, is provided.

The resin composition includes the acid-modified oligomer, the photopolymerizable monomer, the photoinitiator, the functional filler, and the thermocurable binder, and particularly, an iminocarbonate-based compound having a carboxyl group and a photocurable unsaturated functional group is included as the acid-modified oligomer.

DFSR may be formed by the following process using the resin composition of the exemplary embodiment.

First, a film is formed by the resin composition and laminated on a predetermined substrate, and then light exposure is selectively subjected to the portion of the resin composition where the DFSR will be formed. As the light exposure proceeds, the unsaturated functional group contained in the acid-modified oligomer, for example, the iminocarbonate-based compound, and the unsaturated functional group contained in the photopolymerizable monomer, cause photocuring to form a crosslink to each other, and as a result, a crosslinked structure may be formed on a light-exposed area by photocuring.

Thereafter, development is carried out using an alkali developing solution, then the resin composition on the light-exposed area where the crosslinked structure is formed will remain on the substrate, and the resin composition on the remaining unexposed area will be dissolved in the developing solution to be removed.

Thereafter, the resin composition remaining on the substrate is subjected to heat treatment to carry out thermal curing, then the carboxyl group contained in the acid-modified oligomer, for example, the iminocarbonate-based compound, is reacted with the thermally curable functional group of the thermocurable binder to form a crosslink, and as a result, a crosslinked structure by thermal curing is formed, thereby forming the DFSR on the desired portion of the substrate.

Herein, as the resin composition includes the iminocarbonate-based compound as the acid-modified oligomer, a secondary crosslinked structure, for example, a triazine crosslinked structure represented by Chemical Formula 2 in the following Reaction Formula 1 and the like, may be formed in a thermal curing process:

This is formed by nitrogen atoms contained in the main chain of the iminocarbonate-based compound which are linked to each other by heat to form a triazine cycle.

[Reaction Formula 1]

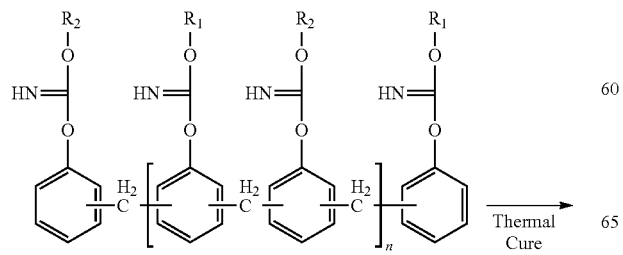

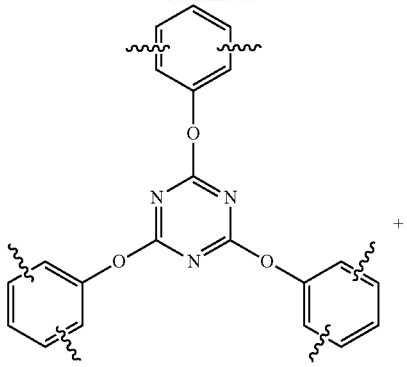

Crosslinked Triazine
Compound derived from R₁ and R₂ wherein n is an integer of 1 to 100.

R₁ may be a functional group derived from the compound having a photocurable unsaturated functional group and a hydroxyl group or a carboxyl group, for example, a functional group derived from a compound of acrylic acid, methacrylic acid, butenoic acid, hexenoic acid, cinnamic acid, allylphenol, hydroxystyrene, hydroxycyclohexene, or hydroxynaphthoquinone. A specific example of R₁ may include a functional group such as

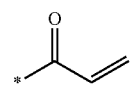

derived from acrylic acid, or

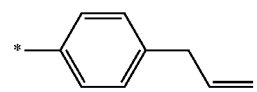 [SMILES: *c1ccc(CC=C)cc1]

derived from allylphenol.

R₂ may be a functional group derived from dicarboxylic acid compounds, for example, one or more compounds selected from the group consisting of oxalic acid, malonic acid, succinic acid, glutaric acid, adipic acid, pimelic acid, suberic acid, azelaic acid, sebacic acid, norbornene dicarboxylic acid, tetrahydrophthalic acid, cycloalkane dicarboxylic acid having 5 to 10 carbon atoms, and acid anhydrides thereof; or one or more compounds selected from the group consisting of phthalic acid, imidazole dicarboxylic acid, pyridine dicarboxylic acid, and acid anhydrides thereof.

A specific example of R₂ may include

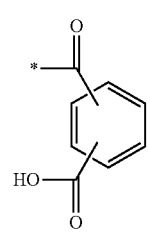

derived from phthalic acid,

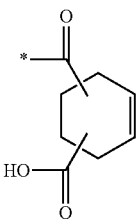

derived from tetrahydrophthalic acid,

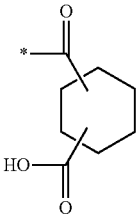

derived from cyclohexane, or the like.

That is, when DFSR is formed by using the resin composition, a secondary triazine crosslinked structure is included in the cured product of the resin composition forming the DFSR, in addition to a basic crosslinked structure (that is, a structure derived from the carboxyl group of the acid-modified oligomer and the thermally curable functional group of the thermocurable binder), and thus the DFSR may have lowered coefficients of thermal expansion of 30 or less in case of α1, and 150 or less in case of α2. This may lead to more improved thermal resistance reliability of the DFSR, and a reduced difference in the coefficient of thermal expansion between the DFSR and the package substrate materials of the semiconductor device, thereby minimizing a warpage problem.

Specifically, the resin composition may have a coefficient of thermal expansion (α1) before a glass transition temperature (Tg) of 10 to 35 ppm, preferably 20 ppm or less, and a coefficient of thermal expansion (α2) after a glass transition temperature (Tg) of 150 ppm or less, or 120 ppm or less, preferably 50 to 100 ppm, after being cured.

Accordingly, when the resin composition of the exemplary embodiment is used, the DFSR representing a lower coefficient of thermal expansion and improved thermal resistance reliability, and being preferably usable as package substrate materials of the semiconductor device and the like, may be provided.

The photocurable and thermocurable resin composition may include the functional filler including one or more selected from the group consisting of carbon allotrope particles having a ceramic compound bound to the surface thereof and heat radiating ceramic particles.

As the functional filler is included, the dry film solder resist manufactured from the photocurable and thermocurable resin composition may secure an electrical insulating property, and have a high thermal conducting property and excellent electromagnetic wave absorption performance without lowering voltage resistance strength. Such effect may be due to the use of the carbon allotrope particles having a ceramic compound bound to the surface thereof, heat radiating ceramic particles, or a mixture thereof.

Specifically, the carbon allotrope particles having a ceramic compound bound to the surface thereof may implement the properties possessed by each of the ceramic compound and the carbon allotrope, and also implement a combined effect of the two or more materials, differently from the case that two or more materials are simply mixed.

In the case that the photocurable and thermocurable resin composition includes the carbon allotrope particles having a ceramic compound bound to the surface thereof, the dry film solder resist finally manufactured without lowering voltage resistance strength may have a high thermal conducting property and excellent electromagnetic wave absorption performance, and thermal resistance generated at the time of being applied in electronic components may be reduced to maximize the thermal conducting property.

The carbon allotrope particles may include one or more selected from the group consisting of graphite, carbon nanotubes (CNT), graphene, and graphene oxide.

The carbon allotrope particles may have a largest diameter of 0.1 μm to 5 μm, or 0.5 μm to 4 μm. If the size of the carbon allotrope particles is too large, the application of the dry film solder resist (DFSR) manufactured using the photocurable and thermocurable resin composition may be disadvantageous to the formation of a fine circuit pattern. In addition, if the particle size of the carbon allotrope particles is too small, a rapid viscosity rise may occur during a fabricating process using the photocurable and thermocurable resin composition or the DFSR formed therefrom.

The ceramic compound may include one or more selected from the group consisting of silica, alumina ($Al_2O_3$), boron nitride (BN), aluminum nitride (AlN), silicon carbide (SiC), magnesium oxide (MgO), zinc oxide (ZnO), and aluminum hydroxide ($Al(OH)_3$).

The carbon allotrope particles having a ceramic compound bound to the surface thereof may include 0.5 wt % to 20 wt % of the ceramic compound and 80 wt % to 99.5 wt % of the carbon allotrope particles. If the content of the ceramic compound is too low, the photocurable and thermocurable resin composition of the exemplary embodiment or the product manufactured therefrom may not sufficiently secure physical properties such as voltage resistance strength or electrical insulation, and is disadvantageous to use as an insulation film for electronic materials. In addition, if the content of the ceramic compound is too high, agglomeration between the filler may occur during a surface treatment process, which is disadvantageous to a dispersion process.

Meanwhile, the heat radiating ceramic particles may disperse heat more effectively, so that the dry film solder resist (DFSR) manufactured using the photocurable and thermocurable resin composition has the improved heat radiating effect.

The heat radiating ceramic particles may include one or more selected from the group consisting of spherical alumina, boron nitride, ammonium nitride, silicon carbonate, and magnesium oxide.

The heat radiating ceramic particles may have a largest diameter of 0.01 μm to 5 μm, or 0.1 μm to 4 μm.

If the size of the heat radiating ceramic particles is too large, the application of the dry film solder resist (DFSR) manufactured using the photocurable and thermocurable resin composition may be disadvantageous to the formation of a fine circuit pattern. In addition, if the size of the heat radiating ceramic particles is too small, a rapid viscosity rise may occur during a fabricating process using the photocurable and thermocurable resin composition or the DFSR formed therefrom.

In the case that the functional filler includes both the carbon allotrope particles having a ceramic compound bound to the surface thereof and the heat radiating ceramic particles, their content ratio is not significantly limited. However, in order to sufficiently secure the thermal conducting property and the excellent electromagnetic wave absorption performance of the DFSR manufactured from the photocurable and thermocurable resin composition, the functional filler may include the heat radiating ceramic particles in a weight ratio of 1 to 80, 2 to 60, or 3 to 30 relative to the carbon allotrope particles having a ceramic compound bound to the surface thereof.

The photocurable and thermocurable resin composition may include 0.1 wt % to 70 wt %, or 10 wt % to 60 wt %, of the functional filler. If the content of the functional filler in the photocurable and thermocurable resin composition is too low, it may be difficult to sufficiently secure the heat radiating effect and the electromagnetic shielding effect.

In addition, if the content of the functional filler in the photocurable and thermocurable resin composition is too high, due to the agglomeration of the filler during the fabricating process using the photocurable and thermocurable resin composition or the DFSR formed therefrom, the physical properties of the final product may be lowered or a process cost may rise, and also the manufactured dry film may be difficult to have uniform physical properties.

Hereinafter, the resin composition according to an exemplary embodiment will be described in more detail for each component.

Acid-Modified Oligomer

The resin composition of the exemplary embodiment includes the iminocarbonate-based compound containing a carboxyl group and a photocurable unsaturated functional group as the acid-modified oligomer. This acid-modified oligomer forms a crosslink with other components of the resin composition, that is, the photopolymerizable monomer and/or the thermocurable binder, by photocuring, thereby allowing the formation of DFSR, and since the acid-modified oligomer contains a carboxyl group, the resin composition on the unexposed area represents alkali developability.

Particularly, as the resin composition includes the iminocarbonate-based compound as the acid-modified oligomer, the triazine crosslinked structure represented by the above Chemical Formula 2 and the like may be formed within the cured product of the resin composition forming the DFSR. Therefore, the resin composition of the exemplary embodiment allows the manufacture and provision of the DFSR having a higher glass transition temperature and improved heat resistance reliability.

The iminocarbonate-based compound may be formed by reacting a cyanate ester-based compound with a dicarboxylic acid compound and a compound having a photocurable unsaturated functional group and a hydroxyl group or a carboxyl group. With the use of this iminocarbonate-based compound, the triazine crosslinked structure may be preferably formed in a thermal curing process, and the DFSR representing better thermal resistance reliability and the like may be provided.

Herein, as the cyanate ester-based compound, a bisphenol-based or novolac-based compound having a cyanide (—OCN) group, for example, a compound of the following Chemical Formula 1a, may be used:

[Chemical Formula 1a]

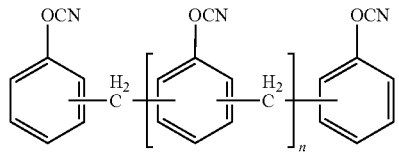

wherein n is an integer of 1 to 100.

In addition, the dicarboxylic acid compound reacted with the cyanate ester-based compound may be an aliphatic dicarboxylic acid compound, an alicyclic dicarboxylic acid compound, or an aromatic dicarboxylic acid compound.

Specifically, the aliphatic dicarboxylic acid compound may include oxalic acid, malonic acid, succinic acid, glutaric acid, adipic acid, pimelic acid, suberic acid, azelaic acid, sebacic acid, norbornene dicarboxylic acid, tetrahydrophthalic acid, cycloalkane dicarboxylic acid having 5 to 10 carbon atoms, acid anhydrides thereof, or a mixture of two or more of those compounds.

In addition, the aromatic dicarboxylic acid compound may include phthalic acid, imidazole dicarboxylic acid, pyridine dicarboxylic acid, acid anhydrides thereof, or a mixture of two or more of those compounds.

The compound having a photocurable unsaturated functional group and a hydroxyl group or a carboxyl group may include acrylic acid, methacrylic acid, cinnamic acid, butenoic acid, hexenoic acid, 2-allylphenol, hydroxystyrene, hydroxycyclohexene, hydroxy naphthoquinone (5-hydroxyl-p-naphthoquinone), or a mixture of two or more thereof.

The above-described cyanate ester-based compound may be reacted with the dicarboxylic acid compound and the compound having a photocurable unsaturated functional group and a hydroxyl group or a carboxyl group, thereby preferably obtaining the iminocarbonate-based compound to which the carboxyl group and the photocurable unsaturated functional group are properly introduced, as the acid-modified oligomer. In addition, the thus-obtained iminocarbonate-based compound may properly form the triazine crosslinked structure during the thermal curing process, thereby allowing the formation and provision of the DFSR representing more improved thermal resistance reliability.

The mole ratio between the carboxyl group and the unsaturated functional group introduced to the above-described iminocarbonate-based compound may be adjusted by controlling the mole ratios of the dicarboxylic acid compound and the compound having the photocurable unsaturated functional group and the hydroxyl group or the carboxyl group, reacted with the cyanate ester-based compound. In order that the iminocarbonate-based compound acts properly as the acid-modified oligomer, the mole ratio between the dicarboxylic acid and the compound having a photocurable unsaturated functional group and a hydroxyl group or a carboxyl group, reacted with the cyanate ester-based compound, may be about 2:8 to 8:2. As the carboxyl group and the unsaturated functional group are properly introduced to the iminocarbonate-based compound as the acid-modified oligomer, the resin composition on the unexposed area represents excellent alkali developability, and the acid-modified oligomer forms a crosslinked structure properly with the photopolymerizable monomer and the thermocurable binder, so that the DFSR may represent better thermal resistance, mechanical physical properties, and the like.

Meanwhile, as a more specific example, the compound formed by reacting the acid-modified oligomer, in particular, the above-described cyanate ester-based compound, with the dicarboxylic acid compound, and the compound having a photocurable unsaturated functional group and a hydroxyl group or a carboxyl group may be the iminocarbonate-based compound of the following Chemical Formula 1:

[Chemical Formula 1]

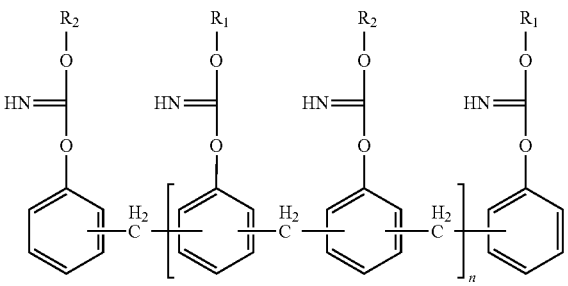

wherein n is an integer of 1 to 100.

In addition, $R_1$ may be a functional group derived from the compound having a photocurable unsaturated functional group and a hydroxyl group or a carboxyl group, for example, a functional group derived from a compound of acrylic acid, methacrylic acid, butenoic acid, hexenoic acid, cinnamic acid, allylphenol, hydroxystyrene, hydroxycyclohexene, or hydroxynaphtoquinone, and as specific examples thereof, a functional group such as

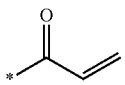 [SMILES: *C(=O)C=C]

derived from acrylic acid,

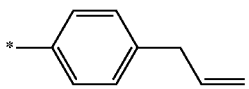 [SMILES: *c1ccc(CC=C)cc1]

derived from allylphenol, or the like.

$R_2$ may be a functional group derived from dicarboxylic acid compounds, for example, one or more compounds selected from the group consisting of oxalic acid, malonic acid, succinic acid, glutaric acid, adipic acid, pimelic acid, suberic acid, azelaic acid, sebacic acid, norbornene dicarboxylic acid, tetrahydrophthalic acid, cycloalkane dicarboxylic acid having 5 to 10 carbon atoms, and acid anhydrides thereof; or one or more compounds selected from the group consisting of phthalic acid, imidazole dicarboxylic acid, pyridine dicarboxylic acid, and acid anhydrides thereof, and as specific examples thereof,

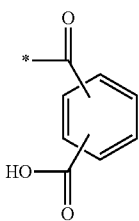

derived from phthalic acid,

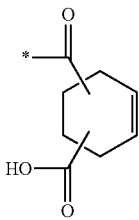

derived from tetrahydrophthalic acid,

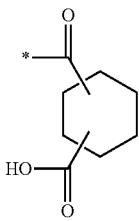

derived from cyclohexane, or the like.

This compound of Chemical Formula 1 may be obtained, for example, by reacting the compound of Chemical Formula 1a, the dicarboxylic acid compound such as phthalic acid, cyclohexane dicarboxylic acid, or tetrahydrophthalic acid, and the compound having an unsaturated functional group such as acrylic acid or 2-allylphenol and a hydroxyl group or a carboxyl group, and may be properly used as the acid-modified oligomer, and may also effectively form the triazine crosslinked structure, thereby allowing the formation and provision of the DFSR having better thermal resistance reliability and the like.

The resin composition of the exemplary embodiment may further include a commonly known acid-modified oligomer, in addition to the above-described iminocarbonate-based compound. However, in the case that the commonly known acid-modified oligomer is further included, for the expression of excellent developability and thermal resistance reliability according to an exemplary embodiment, the acid-modified oligomer of the iminocarbonate-based compound may be included in a content of about 5 to 25 wt %, about 7 to 20 wt %, or about 9 to 15 wt %, and the additional acid-modified oligomer may be included in the remaining content of the total content of the acid-modified oligomer as described below.

This additional acid-modified oligomer may include any component previously known to be usable in a resin composition for forming DFSR, as an oligomer having a functional group capable of being cured with a carboxyl group, for example, an acrylate group, or a photocurable functional group having an unsaturated double bond, and a carboxyl group within the molecule, without any limitation. For example, the main chain of this additional acid-modified oligomer may be novolac epoxy, polyurethane, or the like, and a component to which a carboxyl group, an acrylate group, and the like are introduced to the main chain may be used as the additional acid-modified oligomer. The photocurable functional group may preferably be an acrylate group. Herein, the acid-modified oligomer may be obtained as an oligomer form by copolymerizing a polymerizable monomer having a carboxyl group and a monomer including an acrylate-based compound, and the like.

More specifically, specific examples of the additional acid-modified oligomer usable for the resin composition may include the following components:

(1) a carboxyl group-containing resin obtained by copolymerizing (a) unsaturated carboxylic acid such as (meth)acrylic acid and (b) a compound having an unsaturated double bond such as styrene, α-methylstyrene, a lower alkyl(meth)acrylate, and isobutylene;

(2) a carboxyl group-containing photosensitive resin obtained by reacting a part of a copolymer of (a) unsaturated carboxylic acid and (b) a compound having an unsaturated double bond with a compound having an ethylenic unsaturated group such as a vinyl group, an allyl group, and a (meth)acryloyl group, and a reactive group such as an epoxy group and acid chloride, for example, glycidyl (meth)acrylate, and adding an ethylenic unsaturated group as a pendant thereto;

(3) a carboxyl group-containing photosensitive resin obtained by reacting (a) unsaturated carboxylic acid with a copolymer of (b) a compound having an unsaturated double bond and (c) a compound having an epoxy group and an unsaturated double bond such as glycidyl (meth)acrylate and α-methyl glycidyl (meth)acrylate, and reacting the resultant secondary hydroxyl group with (d) a saturated or unsaturated polybasic acid anhydride such as anhydrous phthalic acid, tetrahydro anhydrous phthalic acid, and hexahydro anhydrous phthalic acid;

(4) a carboxyl group-containing photosensitive resin obtained by reacting a copolymer of (e) an acid anhydride having an unsaturated double bond such as anhydrous maleic acid and anhydrous itaconic acid, and (b) a compound having an unsaturated double bond with (f) a compound having one hydroxyl group and one or more ethylenic unsaturated double bonds such as hydroxylalkyl (meth)acrylate;

(5) a carboxyl group-containing photosensitive compound obtained by carrying out esterification (entire esterification or partial esterification, preferably entire esterification) of an epoxy group of (g) a polyfunctional epoxy compound having two or more epoxy groups in the molecule as follows, or a polyfunctional epoxy resin obtained by further epoxidizing a hydroxyl group of the polyfunctional epoxy compound with epichlorohydrin, and a carboxyl group of (h) an unsaturated monocarboxylic acid such as (meth)acrylic acid, and further reacting a resultant hydroxyl group with (d) saturated or unsaturated polybasic acid anhydride;

(6) a carboxyl group-containing resin obtained by reacting an epoxy group of a copolymer of (b) a compound having an unsaturated double bond and glycidyl (meth)acrylate with (i) an organic acid with one carboxyl group in one molecule and without an ethylenic unsaturated bond such as alkyl carboxylic acid containing 2 to 17 carbon atoms and an aromatic group-containing alkyl carboxylic acid, and reacting the resultant secondary hydroxyl group with (d) a saturated or unsaturated polybasic acid anhydride;

(7) a carboxyl group-containing urethane resin obtained by carrying out a polyaddition reaction of (j) diisocyanate such as aliphatic diisocyanate, branched aliphatic diisocyanate, alicyclic diisocyanate, and aromatic diisocyanate, (k) a carboxyl group-containing dialcohol compound such as dimethylolpropionic acid and dimethylolbutanoic acid, and (m) a diol compound such as a polycarbonate-based polyol, a polyether-based polyol, a polyester-based polyol, a polyolefin-based polyol, an acryl-based polyol, a bisphenol A-based alkylene oxide adduct diol, and a compound having a phenolic hydroxyl group and an alcoholic hydroxyl group;

(8) a photosensitive carboxyl group-containing urethane resin obtained by carrying out a polyaddition reaction of (j) diisocyanate, (n) a (meth)acrylate of a difunctional epoxy resin such as a bisphenol A type of epoxy resin, a hydrogen addition bisphenol A type of epoxy resin, a brominated bisphenol A type of epoxy resin, a bisphenol F type of epoxy resin, a bisphenol S type of epoxy resin, a bixylenol type of epoxy resin, and a biphenol type of epoxy resin, or a modified partial acid anhydride thereof, (k) a carboxyl group-containing dialcohol compound, and (m) a diol compound;

(9) a carboxyl group-containing urethane resin in which an unsaturated double bond is introduced to the terminal, by adding (f) a compound having one hydroxyl group and one or more ethylenic unsaturated double bonds such as a hydroxyalkyl(meth)acrylate during synthesis of the resin of (7) or (8);

(10) a carboxyl group-containing urethane resin obtained by adding a compound having one isocyanate group and one or more (meth)acryloyl groups within the molecule such as an equimolar reactant of isophorone diisocyanate and pentaerythritol triacrylate during synthesis of the resin of (7) or (8), and carrying out terminal (meth)acrylation;

(11) a carboxyl group-containing photosensitive resin obtained by reacting a polyfunctional oxetane compound having two or more oxetane rings in the molecule as follows with (h) an unsaturated monocarboxylic acid to produce a modified oxetane compound, and reacting a primary hydroxyl group in the resultant modified oxetane compound with (d) a saturated or unsaturated polybasic acid anhydride;

(12) a carboxyl group-containing photosensitive resin obtained by introducing an unsaturated double bond to a reaction product of a bisepoxy compound and bisphenols, and continuously reacting (d) the saturated or unsaturated polybasic acid anhydride; and

(13) a carboxyl group-containing photosensitive resin obtained by reacting a reaction product of a novolac type of phenol resin with an alkylene oxide such as ethylene oxide, propylene oxide, butylene oxide, trimethylene oxide, tetrahydrofuran, and tetrahydropyran, and/or a cyclic carbonate such as ethylene carbonate, propylene carbonate, butylene carbonate, and 2,3-carbonate propyl methacrylate, with (h) an unsaturated monocarboxylic acid, and reacting the resultant reaction product with (d) a saturated or unsaturated polybasic acid anhydride.

Among the above-described components, in the case that the isocyanate group-containing compound used in resin synthesis becomes diisocyanate not containing a benzene ring in above (7) to (10), and in the case that the polyfunctional and difunctional epoxy resins used in resin synthesis become a linear-structured compound having a bisphenol A skeleton, a bisphenol F skeleton, a biphenyl skeleton, or a bixylenol skeleton, or a hydrogenated compound thereof in above (5) and (8), components which are preferably usable as the acid-modified oligomer in terms of the flexibility of DFSR may be obtained. In addition, in another aspect, the modified resin in above (7) to (10) is preferred with respect to warpage by including a urethane bonding in the main chain.

Further, commercially available components may be used as the above-described additional acid-modified oligomers, and as specific examples thereof, ZAR-2000, CCR-1235, ZFR-1122, CCR-1291H, or the like available from Nippon Kayaku, Co., Ltd. may be mentioned.

Meanwhile, the above-described acid-modified oligomer may be included in a content of about 15 to 75 wt %, or about 20 to 50 wt %, or about 25 to 45 wt %, based on the total weight of the resin composition of an exemplary embodiment. If the content of the acid-modified oligomer is too low, the developability of the resin composition may be deteriorated, and the strength of the DFSR may be lowered. In contrast, if the content of the acid-modified oligomer is too high, the resin composition may be excessively developed, and the uniformity upon coating may be deteriorated.

In addition, the acid value of the acid-modified oligomer may be about 40 to 120 mg KOH/g, about 50 to 110 mg KOH/g, or about 60 to 90 mg KOH/g. If the acid value is too low, the alkali developability may be lowered, and in contrast, if it is too high, even a photocured area, for example, a light-exposed area, may be dissolved by a developing solution, and thus normal pattern formation of the DFSR may become difficult.

Photopolymerizable Monomer

The resin composition of an exemplary embodiment includes a photopolymerizable monomer. This photopolymerizable monomer may become, for example, a compound having a photocurable unsaturated functional group such as two or more polyfunctional vinyl groups, and form a crosslink with an unsaturated functional group of the above-described acid-modified oligomer, thereby forming a cross-linked structure by photocuring upon light exposure. Thus, the resin composition on the light-exposed area corresponding to a portion where the DFSR will be formed may remain on the substrate without being alkali-developed.

This photopolymerizable monomer may be liquid at room temperature, and thus may also serve to adjust the viscosity of the resin composition of an exemplary embodiment according to a coating method, or to further improve the alkali-developability of the unexposed area.

As the photopolymerizable monomer, an acrylate-based compound having two or more photocurable unsaturated functional groups may be used, and as specific examples thereof, one or more compounds selected from the group consisting of a hydroxyl group-containing acrylate-based compound such as 2-hydroxyethyl acrylate, 2-hydroxypropyl acrylate, pentaerythritol triacrylate, or dipentaerythritol pentaacrylate; a water-soluble acrylate-based compound such as polyethylene glycol diacrylate or polypropylene glycol diacrylate; a polyfunctional polyesteracrylate-based compound of a polyhydric alcohol such as trimethylolpropane triacrylate, pentaerythritol tetraacrylate, or dipentaerythritol hexaacrylate; an acrylate-based compound of an ethylene oxide adduct and/or a propylene oxide adduct of a polyfunctional alcohol such as trimethylolpropane or hydrogenated bisphenol A, or a polyhydric phenol such as bisphenol A or biphenol; a polyfunctional or monofunctional polyurethane acrylate-based compound which is a modified isocyanate of the hydroxyl group-containing acrylate; an epoxyacrylate-based compound which is a (meth)acrylic acid adduct of bisphenol A diglycidyl ether, hydrogenated bisphenol A diglycidyl ether, or phenol novolac epoxy resin; a caprolactone modified acrylate-based compound such as caprolactone modified ditrimethylolpropane tetraacrylate, an acrylate of ε-caprolactone modified dipentaerythritol or a caprolactone modified hydroxyl pivalic acid neopentyl glycol ester diacrylate; and a photosensitive (meth)acrylate compound such as a methacrylate-based compound corresponding to the above-described acrylate-based compound may be used alone, or in combination with two or more compounds thereof.

Among these, as the above photocurable monomer, a polyfunctional (meth)acrylate-based compound having two or more (meth)acryloyl groups in one molecule may be preferably used, and particularly pentaerythritol triacrylate, trimethylolpropane triacrylate, dipentaerythritol hexaacrylate, caprolactone modified ditrimethylol propane tetraacrylate, or the like may be appropriately used. Examples of a commercially available photopolymerizable monomer may include DPEA-12 from Kayarad and the like.

The content of the above-described photopolymerizable monomer may be about 5 to 30 wt %, about 7 to 20 wt %, or about 7 to 15 wt %, based on the total weight of the resin composition. If the content of the photopolymerizable monomer is too low, photocuring may not sufficiently occur, and if the content is too high, the dryness of the DFSR may be poor, and the physical properties may be deteriorated.

Photoinitiator

The resin composition of an exemplary embodiment includes a photoinitiator. This photoinitiator serves to, for example, initiate radical photocuring between the acid-modified oligomer and the photopolymerizable monomer on the light-exposed area of the resin composition.

As the photoinitiator, any known materials, for example, benzoin and its alkyl ether compounds, such as benzoin methyl ether and benzoin ethyl ether; an acetophenone compound such as acetophenone, 2,2-dimethoxy-2-phenylacetophenone, 1,1-dichloroacetophenone, and 4-(1-t-butyl-dioxy-1-methylethyl)acetophenone; an anthraquinone compound such as 2-methylanthraquinone, 2-amylanthraquinone, 2-t-butylanthraquinone, and 1-chloroanthraquinone; a thioxanthone compound such as 2,4-dimethylthioxanthone, 2,4-diisopropylthioxanthone, and 2-chlorothioxanthone; a ketal compound such as acetophenonedimethylketal and benzyldimethylketal; and a benzophenone compound such as benzophenone, 4-(1-t-butyldioxy-1-methylethyl)benzophenone, and 3,3',4,4'-tetrakis(t-butyldioxycarbonyl)benzophenone may be used.

In addition, α-aminoacetophenones such as 2-methyl-1-[4-(methylthio)phenyl]-2-morpholinoprop anon-1,2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, and N,N-dimethylaminoacetophenone (commercially available from Ciba Specialty Chemicals Co., Ltd. (currently Ciba Japan K.K.) as Irgacure® 907, Irgacure 369, Irgacure 379, etc.), or acylphosphine oxides such as 2,4,6-trimethylbenzoyldiphenylphosphine oxide, bis(2,4,6-trimethylbenzoyl)-phenylphosphine oxide, and bis(2,6-dimethoxybenzoyl)-2,4,4-trimethylpentylphosphine oxide (commercially available from BASF Corporation as Luciline® TPO, from Ciba Specialty Chemicals Co., Ltd. as Irgacure 819, etc.) may be used as the photoinitiator.

In addition, as the initiator, an oxime ester compound may be mentioned. The specific examples of the oxime ester compound may include 2-(acetyloxyiminomethyl)thioxanthen-9-one, (1,2-octanedione, 1-[4-(phenylthio)phenyl]-, 2-(O-benzoyloxime)), (ethanone, 1-[9-ethyl-6-(2-methylbenzoyl)-9H-carbazol-3-yl]-, 1-(O-acetyl oxime)), and the like. As the commercially available products, GGI-325, Irgacure OXE01, Irgacure OXE02 from Ciba Specialty Chemicals, Co., Ltd, N-1919 from ADEKA Corporation, and Darocur TPO from Ciba Specialty Chemicals, Co., Ltd. may be mentioned.

The content of the photoinitiator may be about 0.5 to 20% by weight, about 1 to 10% by weight, or about 1 to 5% by weight, based on the total weight of the resin composition. If the content of the photoinitiator is too low, photocuring may not occur properly, and if the content is too high, the resolution of the resin composition may be reduced, or the reliability of the DFSR may not be sufficient.

Thermocurable Binder

The resin composition of an exemplary embodiment may also include a thermocurable binder having one or more selected from the group consisting of a thermally curable functional group, for example, an epoxy group, an oxetanyl group, a cyclic ether group, and a cyclic thioether group. This thermocurable binder may form a crosslink with the acid-modified oligomer and the like by thermocuring, thereby guaranteeing thermal resistance or mechanical properties of the DFSR.

This thermocurable binder may have a softening point of about 70 to 100° C., through which unevenness at the time of lamination may be reduced. If the softening point is too low, the tackiness of the DFSR may be increased, and if it is too high, the flowability of the DFSR may be deteriorated.

As the thermocurable binder, a resin having two or more cyclic ether groups and/or cyclic thioether groups (hereinafter referred to as cyclic (thio)ether groups), and also a difunctional epoxy resin, may be used. Other diisocyanates and difunctional block isocyanates may also be used.

The thermocurable binder having two or more cyclic (thio)ether groups in the molecule may be a compound having two or more groups of either one or both of a 3-, 4-, or 5-membered cyclic ether group, and a cyclic thioether group, in the molecule. Further, the thermocurable binder may be a polyfunctional epoxy compound having at least two epoxy groups in the molecule, a polyfunctional oxetane compound having at least two oxetanyl groups in the molecule, an episulfide resin having two or more thioether groups in the molecule, or the like.

As the specific examples of the polyfunctional epoxy compound, for example, a bisphenol A type of epoxy resin, a hydrogenated bisphenol A type of epoxy resin, a brominated bisphenol A type of epoxy resin, a bisphenol F type of epoxy resin, a bisphenol S type of epoxy resin, a novolac type of epoxy resin, a phenol novolac type of epoxy resin, a cresol novolac type of epoxy resin, an N-glycidyl type of epoxy resin, a novolac type of epoxy resin of bisphenol A, a bixylenol type of epoxy resin, a biphenol type of epoxy resin, a chelate type of epoxy resin, a glyoxal type of epoxy resin, an amino group-containing epoxy resin, a rubber modified epoxy resin, a dicyclopentadiene phenolic type of epoxy resin, a diglycidyl phthalate resin, a heterocyclic epoxy resin, a tetraglycidyl xylenoylethane resin, a silicone modified epoxy resin, an ε-caprolactone modified epoxy resin, and the like may be mentioned. In addition, for imparting flame retardancy, an atom such as phosphorus may be introduced to the structure. These epoxy resins may have improved properties such as adhesion with a cured coating, thermal resistance of a solder, or electroless plating resistance by thermocuring.

As the polyfunctional oxetane compound, in addition to polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, or oligomers or copolymers thereof, etherified products of oxetane alcohol with a resin having a hydroxyl group such as a novolac resin, poly(p-hydroxystyrene), cardo-type bisphenols, calixarenes, calix resorcinarenes, silsesquioxane, and the like may be mentioned. Further, a copolymer of an unsaturated monomer having an oxetane ring, an alkyl (meth)acrylate, and the like may be included.

As the compound having two or more cyclic thioether groups in the molecule, for example, a bisphenol A type of episulfide resin YL7000 from Japan Epoxy Resin, Co., Ltd, etc. may be mentioned. Further, an episulfide resin obtained by replacing an oxygen atom of the epoxy group in the novolac type of epoxy resin with a sulfur atom may be used.

In addition, YDCN-500-80P available from Kukdo Chemical Co., Ltd. and the like may be used as a commercially available product.

The thermocurable binder may be included in a content corresponding to about 0.8 to 2.0 equivalents relative to 1 equivalent of the carboxyl group of the acid-modified oligomer. If the content of the thermocurable binder is too low, a carboxyl group may remain in the DFSR after curing, thereby decreasing thermal resistance, alkali resistance, an electrical insulating property, or the like. In contrast, if the content is too high, a cyclic (thio)ether group with low molecular weight may remain in a dry coating, thereby decreasing the strength of the coating and the like, which is undesirable.

In addition to each component described above, the resin composition of an exemplary embodiment may further include a solvent; and one or more selected from the group consisting of a thermocurable binder catalyst, a filler, a pigment, and an additive as described below.

Thermocurable Binder Catalyst

A thermocurable binder catalyst serves to accelerate thermocuring of the thermocurable binder.

As the thermocurable binder catalyst, for example, imidazole, an imidazole derivative such as 2-methylimidazole, 2-ethylimidazole, 2-ethyl-4-methylimidazole, 2-phenylimidazole, 4-phenylimidazole, 1-cyanoethyl-2-phenyl-imidazole, and 1-(2-cyanoethyl)-2-ethyl-4-methylimidazole; an amine compound such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; a hydrazine compound such as adipic acid dihydrazide and sebacic acid dihydrazide; and a phosphorus compound such as triphenylphosphine, and the like may be mentioned. In addition, as those commercially available, for example, 2MZ-A, 2MZ-OK, 2PHZ, 2P4BHZ, and 2P4MHZ (all are the product names of an imidazole-based compound) available from Shikoku Chemicals Corporation, U-CAT3503N and UCAT3502T (all are the product names of a block isocyanate compound of dimethylamine) available from San-Apro Ltd., DBU, DBN, U-CATS A102, and U-CAT5002 (all are bicyclic amidine compound and the salt thereof), and the like may be mentioned. Particularly, though not limited thereto, a thermocurable catalyst of an epoxy resin or an oxetane compound, or a catalyst accelerating the reaction of an epoxy group and/or an oxetanyl group and a carboxyl group may be mentioned, and they may be used alone, or in combination of two or more. In addition, S-triazine derivatives, such as guanamine, acetoguanamine, benzoguanamine, melamine, 2,4-diamino-6-methacryloyloxyethyl-S-triazine, 2-vinyl-4,6-diamino-S-triazine, a 2-vinyl-4,6-diamino-S-triazine-isocyanuric acid adduct, a 2,4-diamino-6-methacryloyloxyethyl-S-triazine-isocyanuric acid adduct, and the like may be used, and preferably a compound also functioning as an adhesion imparting agent may be used in combination with the thermocurable binder catalyst.

The content of the thermocurable binder catalyst may be about 0.3 to 15 wt %, based on the total weight of the resin composition, in terms of appropriate thermal curing.

Filler

The photocurable and thermocurable resin composition may further include an additional filler, in addition to the above-described functional filler. The thus-added filler serves to improve thermal resistance stability, dimensional stability by heat, and resin adhesive strength. In addition, the filler also serves as an extender pigment by reinforcing colors.

As the filler, an inorganic or organic filler, for example, barium sulfate, barium titanate, amorphous silica, crystalline silica, molten silica, spherical silica, talc, clay, magnesium carbonate, calcium carbonate, aluminum oxide (alumina), aluminum hydroxide, mica, and the like may be used.

Pigment

A pigment serves to express visibility and hiding power, thereby hiding defects such as a scratch of a circuit line.

As the pigment, red, blue, green, yellow, and black pigments and the like may be used. As the blue pigment, Phthalocyanine Blue, Pigment Blue 15:1, Pigment Blue 15:2, Pigment Blue 15:3, Pigment Blue 15:4, Pigment Blue 15:6, Pigment Blue 60, and the like may be used. As the green pigment, Pigment Green 7, Pigment Green 36, Solvent Green 3, Solvent Green 5, Solvent Green 20, Solvent Green 28, and the like may be used. As the yellow pigment, anthraquinone-based, isoindolinone-based, condensed azo-based, and benzimidazolone-based pigments and the like, for example, Pigment Yellow 108, Pigment Yellow 147, Pigment Yellow 151, Pigment Yellow 166, Pigment Yellow 181, Pigment Yellow 193, and the like may be used.

It is preferred that the content of the pigment is about 0.5 to 3 wt %, based on the total weight of the resin composition. If the content is less than 0.5 wt %, visibility and hiding power may be deteriorated, and if the content is more than 3 wt %, thermal resistance may be lowered.

Additive

An additive may be added for removing air bubbles from the resin composition, or removing popping or craters on the surface at the time of film coating, imparting flame retardancy, controlling viscosity, or acting as a catalyst and the like.

Specifically, known and commonly used additives, for example, a known and commonly used thickener such as pulverized silica, organic bentonite, montmorillonite, and the like; an anti-forming agent and/or a leveling agent such as silicon-based, fluorine-based, and polymer-based additives, and the like; a silane coupling agent such as imidazole-based, thiazole-based, and triazole-based additives, and the like; and a flame retardant such as phosphorus-based and antimony-based flame retardants and the like may be combined.

Among these, a leveling agent serves to remove popping or craters on the surface at the time of film coating, and for example, BYK-380N, BYK-307, BYK-378, and BYK-350 from BYK-Chemie GmbH, and the like may be used.

It is preferred that the content of the additive is about 0.01 to 10 wt %, based on the total weight of the resin composition.

Solvent

One or more solvents may be used in combination in order to dissolve the resin composition or impart appropriate viscosity.

As the solvent, ketones such as methyl ethyl ketone or cyclohexanone; aromatic hydrocarbons such as toluene, xylene, or tetramethyl benzene; glycol ethers (cellosolve) such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, or triethylene glycol monomethyl ethers; ester acetates such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, or dipropylene glycol monomethyl ether acetate; alcohols such as ethanol, propanol, ethylene glycol, propylene glycol, or carbitol; aliphatic hydrocarbons such as octane or decane; a petroleum-based solvent such as petroleum ether, petroleum naphtha, hydrogenated petroleum naphtha, or solvent naphtha; and amides such as dimethylacetamide or dimethylformamide (DMF) may be mentioned. These solvents may be used alone or in combination of two or more.

The content of the solvent is about 5 to 50 wt %, based on the total weight of the resin composition. If the content is less than 5 wt %, the solvent has high viscosity, thereby deteriorating a coating property, and if the content is more than 50 wt %, the solvent does not dry well, thereby increasing stickiness.

Meanwhile, according to another exemplary embodiment of the present invention, a dry film solder resist including: a cured product of an acid-modified oligomer including an iminocarbonate-based compound containing a carboxyl group and a photocurable unsaturated functional group; a photopolymerizable monomer having two or more photocurable unsaturated functional groups; and a thermocurable binder having a thermally curable functional group, and a functional filler dispersed in the cured product and including one or more selected from the group consisting of carbon allotrope particles having a ceramic compound bound to a surface thereof and heat radiating ceramic particles, is provided.

The process of manufacturing the dry film solder resist (DFSR) using the photocurable and thermocurable resin composition of the exemplary embodiment will be outlined in the following.

First, the resin composition of the exemplary embodiment is coated on a carrier film as photosensitive coating materials with a comma coater, a blade coater, a lip coater, a rod coater, a squeeze coater, a reverse coater, a transfer roll coater, a gravure coater, a spraying coater, or the like, and then passed through an oven at 50 to 130° C. for 1 to 30 minutes to be dried, and a release film is stacked thereon, so that a dry film including a carrier film, a photosensitive film, and a release film from the bottom may be manufactured.

The photosensitive film may have a thickness of about 5 to 100 μm.

Herein, as the carrier film, a plastic film such as polyethylene terephthalate (PET), a polyester film, a polyimide film, a polyamideimide film, a polypropylene film, and a polystyrene film may be used, and as the release film, polyethylene (PE), a polytetrafluoroethylene film, a polypropylene film, surface-treated paper, and the like may be used. When the release film is released, it is preferred that the adhesive strength between the photosensitive film and the release film is lower than the adhesive strength between the photosensitive film and the carrier film.

Next, after releasing the release film, the photosensitive film layer is adhered to the substrate on which a circuit is formed, using a vacuum laminator, a hot roll laminator, a vacuum press, and the like.

Next, the substrate is exposed to light having a constant wavelength range (UV, etc.). Exposure is carried out selectively with a photomask, or directly with a laser direct exposure device thereby being patterned. The carrier film is released after exposure. An exposure amount varies with the thickness of a coating, however, is preferably 0 to 1000 mJ/cm$^2$. As the exposure proceeds, for example, photocuring may occur on the exposed area to form a crosslink between unsaturated functional groups contained in the acid-modified oligomer (for example, the above-described iminocarbonate-based compound), the photopolymerizable monomer, and the like, and as a result, the exposed area may be in the state of not being removed by subsequent development. In comparison, on the unexposed area, crosslinks and a crosslinked structure therefrom are not formed, and a carboxyl group is retained, so that the unexposed area may be in an alkali-developable state.

Next, development is carried out using an alkali solution, and the like. As the alkali solution, an alkali aqueous solution such as potassium hydroxide, sodium hydroxide, sodium carbonate, potassium carbonate, sodium phosphate, sodium silicate, ammonia, and amines may be used. By this development, only the film on the exposed area may remain.

Lastly, by heat curing (post cure), a printed circuit board including the solder resist formed from the photosensitive film is completed. The heat curing temperature is appropriately 100° C. or more.

By the above-described method and the like, the DFSR and the printed circuit board including the same may be provided. As the DFSR undergoes photocuring and thermal curing, it may include the cured product of the acid-modified oligomer including the iminocarbonate-based compound containing a carboxyl group and a photocurable unsaturated functional group; the photopolymerizable monomer having two or more photocurable unsaturated functional groups; and the thermocurable binder having the thermally curable functional group. Further, the dry film solder resist may include the functional filler dispersed in the cured product, and including one or more selected from the group consisting of carbon allotrope particles having a ceramic compound bound to the surface thereof and heat radiating ceramic particles.

More specifically, the cured product may include a crosslinked structure in which the carboxyl group of the iminocarbonate-based compound and the thermally curable functional group are crosslinked by thermal curing; a crosslinked structure in which the iminocarbonate-based compound and the unsaturated functional group of the photopolymerizable monomer are crosslinked to each other by photocuring; and a triazine crosslinked structure of Chemical Formula 2 derived from the iminocarbonate-based compound.

Particularly, as the cured product includes the triazine crosslinked structure derived from the iminocarbonate-based compound, the DFSR may have a higher glass transition temperature of 100 to 180° C., or 130 to 180° C., for example, about 140 to 170° C., or about 150° C., and represent more improved heat resistant reliability. Therefore, the DFSR satisfies overall physical properties such as excellent PCT resistance, TCT thermal resistance, and HAST resistance between fine wires which are required for the package substrate materials and the like of a semiconductor device, and thus may be preferably used as package substrate materials of a semiconductor device and the like.

The dry film solder resist may have a coefficient of thermal expansion (al) before a glass transition temperature (Tg) of 10 to 35 ppm, preferably 20 ppm or less, and a coefficient of thermal expansion ($\alpha 2$) after a glass transition temperature (Tg) of 150 ppm or less, or 120 ppm or less, preferably 50 to 100 ppm.

In addition, the DFSR may further include a small remaining amount of the photoinitiator after participating in photocuring, in a state of being dispersed in the cured product.

As described above, as the resin composition used in the manufacture of the dry film solder resist of the exemplary embodiment includes the functional filler including one or more selected from the group consisting of the carbon allotrope particles having a ceramic compound bound to the surface thereof and heat radiating ceramic particles, the dry film solder resist may secure an electrical insulating property, and have a high thermal conducting property and excellent electromagnetic absorption performance without lowering voltage resistance strength. These effects may be due to the use of the carbon allotrope particles having a ceramic compound bound to the surface thereof, heat radiating ceramic particles, or a mixture thereof.

Specifically, the carbon allotrope particles having a ceramic compound bound to the surface thereof may implement the properties possessed by each of the ceramic compound and the carbon allotrope, and also implement a combined effect of two or more materials, differently from the case that two or more materials are simply mixed.

In the case that the photocurable and thermocurable resin composition includes the carbon allotrope particles having a ceramic compound bound to the surface thereof, the dry film solder resist finally manufactured without lowering voltage resistance strength may have a high thermal conducting property and excellent electromagnetic wave absorption performance, and thermal resistance generated at the time of being applied in electronic components may be reduced to maximize the thermal conducting property.

The carbon allotrope particles may include one or more selected from the group consisting of graphite, carbon nanotubes (CNT), graphene, and graphene oxide.

The carbon allotrope particles may have a largest diameter of 0.1 μm to 5 μm, or 0.5 μm to 4 μm.

The ceramic compound may include one or more selected from the group consisting of silica, alumina ($Al_2O_3$), boron nitride (BN), aluminum nitride (AlN), silicon carbide (SiC), magnesium oxide (MgO), zinc oxide (ZnO), and aluminum hydroxide ($Al(OH)_3$).

The heat radiating ceramic particles may include one or more selected from the group consisting of spherical alumina, boron nitride, ammonium nitride, silicon carbonate, and magnesium oxide.

The heat radiating ceramic particles may have a largest diameter of 0.01 μm to 5 μm, or 0.1 μm to 4 μm.

The dry film solder resist may have thermal conductivity of 0.2 W/mK to 3.5 W/mK.

The dry film solder resist may have insulation resistance according to an IPC standard of $10*10^{11} \Omega$ or less, or $0.5*10^{11} \Omega$ to $10*10^{11} \Omega$.

The dry film solder resist may have a coefficient of thermal expansion (al) before glass transition temperature (Tg) of 10 to 35 ppm, and a coefficient of thermal expansion ($\alpha 2$) after glass transition temperature (Tg) of 150 ppm or less.

The dry film solder resist may have a glass transition temperature (Tg) of 100° C. to 180° C.

The details for the components which may be included in the dry film solder resist include the above-described description for the photocurable and thermocurable resin composition of the exemplary embodiment.

Hereinafter, the present disclosure will be explained in detail with reference to the following examples. However, these examples are only to illustrate the inventive concept, and the scope of the inventive concept is not limited thereto.

EXAMPLES AND COMPARATIVE EXAMPLES: MANUFACTURE OF RESIN COMPOSITION, DRY FILM, AND PRINTED CIRCUIT BOARD

Examples 1 to 3

A bisphenol-based cyanate ester compound, BA-230 from Lonza, was used as an iminocarbonate-based compound of the acid-modified oligomer, and the cyanate group contained in the bisphenol-based cyanate ester compound, BA-230, was reacted with acrylic acid and 1,2,3,6-tetrahydrophthalic acid (4-cyclohexene-1,2-dicarboxylic acid) in a mole ratio of 1:1, thereby preparing an iminocarbonate compound which is the acid-modified oligomer.

45 g of this iminocarbonate-based compound was used, and 15 g of ZAR-2000 from Nippon Kayaku, Co., Ltd. as an additional acid-modified oligomer, 10 g of DPHA from SK Cytec Co., Ltd. as a photopolymerizable monomer, 2.5 g of TPO as a photoinitiator, 15 g of YDCN-500-80P from Nippon Kayaku, Co., Ltd. as a thermocurable binder, 0.25 g of 2-PI as a thermocurable binder catalyst, and an inorganic filler described in the following Table 1, 0.3 g of Phthalocyanine Blue as a pigment, 3.5 g of BYK-110 as a dispersant, and 20 g of DMF as a solvent were mixed therewith, thereby preparing a resin composition.

The resin composition prepared as above was applied on PET which is a carrier film, and passed through an oven at 75° C. to be dried, and then PE was stacked thereon as a release film, thereby manufacturing a dry film including a carrier film, a photosensitive film (thickness 20 μm), and a release film from the bottom.

After releasing the cover film of the manufactured dry film, a photosensitive film layer was vacuum-stacked on the substrate where a circuit is formed, and a photomask corresponding to a circuit pattern was placed on the photosensitive film layer, and exposed to UV. Exposure proceeded with UV having wavelength range of 365 nm at an exposure amount of 350 mJ/cm$^2$. Thereafter, the PET film was removed, and development with an alkaline solution of 1 wt % $Na_2CO_3$ at 31° C. for a certain period of time was carried out to remove an undesired part, thereby forming a desired pattern. Subsequently, photocuring at an exposure amount of 1000 mJ/cm$^2$ was carried out, and lastly, heat curing proceeded at 160 to 170° C. for 1 hour, thereby completing a printed circuit board including a protective film (solder resist) formed from the photosensitive film.

The specific compositions of the resin compositions of Examples 1 to 3 are summarized in the following Table 1.

TABLE 1

Compositions of Examples 1 to 3 [unit: g]

| Components | Component names (or Product names) | Example 1 | Example 2 | Example 3 |
|---|---|---|---|---|
| Acid-modified oligomer | Iminocarbonate-based compound | 45 | 45 | 45 |
| | ZAR-2000 | 15 | 15 | 15 |
| Photopolymerizable monomer | DPHA | 10 | 10 | 10 |
| Thermocurable binder (Epoxy resin) | YDCN-500-90P | 15 | 15 | 15 |
| Thermosetting agent | 2-PI | 0.25 | 0.25 | 0.25 |
| Photoinitiator | Darocur TPO | 2.5 | 2.5 | 2.5 |
| Dispersant | BYK-110 | 3.5 | 3.5 | 3.5 |
| Pigment | Phthalocyanine Blue | 0.3 | 0.3 | 0.3 |
| Inorganic filler | Spherical alumina 1 (Particle diameter 0.3 to 0.5 μm) | 80 | 80 | 80 |
| | Spherical alumina 1 (Particle diameter 0.1 μm or less) | 40 | 40 | 40 |
| | CNT which is surface treated with alumina (5 wt %) (Particle diameter of about 1 μm) | 5 | 10 | 15 |
| Solvent | DMF | 20 | 20 | 20 |

Comparative Examples 1 and 3

The resin composition was prepared in the same manner as Example 1, except that the inorganic filler of the following Table 2 was used instead of the inorganic filler of the above Table 1.

A dry film was manufactured from the resin composition prepared above in the same manner as Example 1, and a printed circuit board including the protective film (solder resist) formed from a photosensitive film in the dry film was completed.

TABLE 2

Compositions of Comparative Examples 1 to 3 [unit: g]

| Components | Component names (or Product names) | Comparative Example 1 | Comparative Example 2 | Comparative Example 3 |
|---|---|---|---|---|
| Acid-modified oligomer | Iminocarbonate-based compound | 45 | 45 | 45 |
| | ZAR-2000 | 15 | 15 | 15 |
| Photopolymerizable monomer | DPHA | 10 | 10 | 10 |
| Thermocurable binder (Epoxy resin) | YDCN-500-90P | 15 | 15 | 15 |
| Thermosetting agent | 2-PI | 0.25 | 0.25 | 0.25 |
| Photoinitiator | Darocur TPO | 2.5 | 2.5 | 2.5 |
| Dispersant | BYK-110 | 3.5 | 3.5 | 3.5 |
| Pigment | Phthalocyanine Blue | 0.3 | 0.3 | 0.3 |
| Inorganic filler | $BaSO_4$ | 20 | 40 | 80 |
| Solvent | DMF | 20 | 20 | 20 |

EXPERIMENTAL EXAMPLES

The physical properties of the dry films and the printed circuit boards manufactured in the above examples and comparative examples were measured in the following way.

Experimental Example 1: Developability (Sensitivity) Evaluation

A 12 μm copper foil laminated plate, from Mitsui Mining & Smelting Co., Ltd., was cut into a size of 5 cm×5 cm, and fine roughness was formed on the surface of the copper foil by chemical etching. After removing the release film from each dry film manufactured in the above examples and comparative examples, the film layer was vacuum-laminated on the copper foil laminated plate (substrate) where roughness is formed, with a vacuum laminator (MVLP-500, Meiki Co., Ltd.).

Then, a negative type of photomask having a hole shape with a diameter of 80 μm was closely adhered thereto, and exposed to UV having a wavelength range of 365 nm at an exposure amount of 350 mJ/cm$^2$. Thereafter, the PET film was removed, and development with an alkaline solution of 1 wt % $Na_2CO_3$ at 31° C. was carried out for a certain period of time, thereby forming a pattern.

Then, the shape of the above-formed pattern was observed with SEM, thereby evaluating it according to the following criteria.

1: The cross-section is straight-shaped, and no film residue remains at the bottom.
2: The cross-section is not straight-shaped, and there is an under cut or overhang in the hole shape.
3: Observed in undeveloped state.
4: No pattern formed due to overdevelopment.

Experimental Example 2: Tg and Coefficient of Thermal Expansion

On a shiny surface of 12 μm copper foil, 3EC-M3-VLP from Mitsui Mining & Smelting Co., Ltd., a film layer was laminated, as in the same manner of preparing a specimen for measuring PCT thermal resistance and the like. The process was progressed to heat curing in the same manner as preparation of the specimen for measuring the PCT thermal resistance and the like, except that negative type of mask having a stripe pattern with a width of 5 mm and an interval of 5 mm was placed on the specimen, and exposed to light, thereby manufacturing a DFSR specimen. Finally, a specimen having a 5 mm stripe pattern for evaluating TMA (thermal mechanical analysis, METTLER TOLEDO, TMA/SDTA 840) was manufactured by releasing the copper foil from the specimen.

Glass transition temperature (Tg) was measured in the following method. First, the specimen was mounted on the holder so as to have a length of 10 mm, and a force of 0.05 N was applied to both ends, thereby measuring the stretched length of the specimen under the condition of a heating rate from 50° C. to 250° C. at 10° C./min. An inflection point shown in a rising temperature interval was defined as Tg, which was evaluated in the following method:
 1: Tg of 150° C. or more;
 2: Tg of 140° C. or more but less than 150° C.
 3: Tg of 120° C. or more but less than 140° C.
 4: Tg of 100° C. or more but less than 120° C.
 5: Tg less than 100° C.

Then, a coefficient of thermal expansion (CTE) required by the measurement of Tg at the same time was also measured and compared. First, α1, a coefficient of thermal expansion at a lower temperature than Tg was calculated from the slope of the stretched specimen from 50° C. to 80° C., and α2, a coefficient of thermal expansion at a higher temperature than Tg was calculated from the slope of the stretched specimen from 170° C. to 210° C. This calculation result was evaluated by the following standard.

(Coefficient of Thermal Expansion α1)
 1: α1 less than 20 ppm
 2: α1 of 20 ppm or more but less than 30 ppm
 3: α1 of 30 ppm or more but less than 50 ppm
 4: α1 of 50 ppm or more (Coefficient of Thermal Expansion α2)
 1: α2 less than 100 ppm
 2: α2 of 100 ppm or more but less than 120 ppm
 3: α2 of 120 ppm or more but less than 150 ppm
 3: α2 of 150 ppm or more but less than 200 ppm
 4: α2 of 200 ppm or more Experimental Example 3: PCT Thermal Resistance and Electroless Nickel Plating Resistance A copper foil laminated plate (LG-T-500GA from LG Chem, Ltd., thickness: 0.1 mm, copper foil thickness: 12 μm) was cut into a size of 5 cm×5 cm, and fine roughness was formed on the surface of the copper foil by chemical etching. After removing the release film from each dry film manufactured in the above examples and comparative examples, the film layer was vacuum-laminated on the copper foil laminated plate (substrate) where roughness is formed, with a vacuum laminator (MVLP-500, Meiki Co., Ltd.), and then exposed to UV having a wavelength range of 365 nm at an exposure amount at 350 mJ/cm². Thereafter, the PET film was removed, development with an alkaline solution of 1 wt % $Na_2CO_3$ at 31° C. was carried out for a certain period of time, and photocuring was carried out at an exposure amount of about 1000 mJ/cm². Thereafter, heat curing at about 170° C. was carried out for 1 hour to manufacture specimens.

This specimen was treated under the condition of a temperature of 121° C., humidity being 100% saturated, and pressure of 2 atm for 192 hours, using a PCT device (HAST system TPC-412MD, ESPEC Corp.), and the state of the coating was observed. The observation result was evaluated by the following standard.

1: No delamination, blister, or discoloration of DFSR
 2: Delamination, blister, or discoloration of DFSR, but not worse than following 3
 3: Severe delamination, blister, or discoloration of DFSR Next, the above specimen was treated with an electroless nickel plating solution (ELN-M, ELN-A from Poongwon Chemical Co., Ltd.) at 85° C. for 30 minutes, and then the state of the coating was observed, thereby evaluating the electroless nickel plating resistance by the following standard.

1: No whitening of DFSR
 2: Slight whitening of DFSR, but not worse than following 3
 3: Severe whitening of DFSR Experimental Example 4: Measurement of Absorptiveness Copper foil, ICS-25 um from Iljin Material Industries Co., Ltd. was cut into a size of 11 cm×11 cm, and its mass was measured. Then each dry film manufactured in the examples and the comparative examples was cut into a size of 10 cm×10 cm, and the release film was removed therefrom. Then the specimen was manufactured in the same manner as the sample for PCT thermal resistance measurement, and its mass was measured.

This specimen was treated under the condition of a temperature of 85° C. and humidity of 85%, for 24 hours, using isothermal-isohumidity equipment (SH-941 from ESPEC Corp.), and its mass was measured.
 1) Moisture absorption rate (%)=(mass of absorbed moisture/mass of sample)*100
 2) Mass of absorbed moisture=(mass of specimen after isothermal-isohumidity treatment)−(mass of specimen before isothermal-isohumidity treatment)
 3) Mass of sample=(mass of specimen before isothermal-isohumidity treatment)−(mass of copper foil)

Experimental Example 5: Pencil Hardness Measurement

A copper foil laminated plate (LG-T-500GA from LG Chem, Ltd., thickness: 0.1 mm, copper foil thickness: 12 μm) was cut into a size of 5 cm×5 cm, and fine roughness was formed on the surface of the copper foil by chemical etching. After removing the release film from each dry film manufactured in the above examples and comparative examples, the film layer was vacuum-laminated on the copper foil laminated plate (substrate) where roughness is formed, with a vacuum laminator (MVLP-500, Meiki Co., Ltd.).

Then, a negative type of photomask having a hole shape with a diameter of 80 μm was closely adhered thereto, and exposed to UV having a wavelength range of 365 nm at an exposure amount of 350 mJ/cm². Thereafter, the PET film was removed, development with an alkaline solution of 1 wt % $Na_2CO_3$ at 31° C. was carried out for a certain period of time, and photocuring was carried out at an exposure amount of about 1000 mJ/cm². Then, heat curing was carried out at about 170° C. for 1 hour to manufacture a specimen, which was cut into a size of 11 cm*11 cm.

Using a set of pencils for measuring hardness (Mitsubishi), and a pencil hardness tester (CK Trading Co.), a scratch level of the specimen at a constant speed was measured under a load of 100 g. Using the pencils having the hardness from B to 9H of the set of pencils, the hardness of the pencil which did not peel off the coating was identified.

Experimental Example 6: Insulation Resistance Measurement

Using a vacuum laminator (MVLP-500 from Meiki Co., Ltd.), each dry film manufactured in the examples and the comparative examples was vacuum-laminated on an FR-4 substrate where a comb-type electrode of pattern B of IPC standards was formed.

Then, a negative type of photomask having a hole shape with a diameter of 80 μm was closely adhered to the substrate, and exposed to UV having a wavelength range of 365 nm at an exposure amount of 350 mJ/cm². Thereafter, the PET film was removed, development with an alkaline solution of 1 wt % $Na_2CO_3$ at 31° C. was carried out for a certain period of time, and photocuring was carried out at an exposure amount of about 1000 mJ/cm². Thereafter, heat curing at 170° C. was carried out for 1 hour to manufacture a specimen.

The insulation resistance value of the electrode in the obtained specimens was measured at an applied voltage of 500 V.

Experimental Example 7: Thermal Conductivity Measurement

A 12 μm copper foil laminated plate (3EC-M3-VLP from Mitsui Mining & Smelting Co., Ltd.) was cut into a size of 15 cm×15 cm, and each dry film manufactured in the examples and the comparative examples was vacuum-laminated several times on the copper foil laminated plate prepared to the predetermined size, using a vacuum laminator (MVLP-500 from Meiki Co., Ltd.), thereby having a thickness of about 100 μm.

Then, a negative type of photomask having a hole shape with a diameter of 12.7 μm was closely adhered to the substrate, and exposed to UV having a wavelength range of 365 nm at an exposure amount of 350 mJ/cm². Thereafter, the PET film was removed, development with an alkaline solution of 1 wt % $Na_2CO_3$ at 31° C. was carried out for a certain period of time, and photocuring was carried out at an exposure amount of about 1000 mJ/cm². Thereafter, heat curing at about 170° C. was carried out for 1 hour, and the copper foil was removed using an etching solution, thereby manufacturing a specimen for measuring thermal conductivity.

The thermal conductivity was calculated by the formula [density*specific heat*coefficient of thermal diffusion], the density was measured using Mettler Toledo equipment, and the specific heat and the coefficient of thermal diffusion were measured using LFA 447 equipment from Netzch.

Experimental Example 8: Electromagnetic Wave Shielding Rate

A 12 μm copper foil laminated plate (3EC-M3-VLP from Mitsui Mining & Smelting Co., Ltd.) was cut into a size of 15 cm×15 cm, and each dry film manufactured in the examples and the comparative examples was vacuum-laminated several times on the copper foil laminated plate using a vacuum laminator (MVLP-500 from Meiki Co., Ltd.), thereby having a thickness of about 100 μm.

Then, a negative type of photomask having a hole shape with a diameter of 13.3 cm was closely adhered to the substrate, and exposed to UV having a wavelength range of 365 nm at an exposure amount of 350 mJ/cm². As a reference sample, a negative type of photomask manufactured to have an internal conductor diameter of 3.2 cm and an outer conductor internal diameter of 7.6 cm/external diameter of 13.3 cm was used.

Thereafter, development with an alkaline solution of 1 wt % $Na_2CO_3$ at 31° C. was carried out for a certain period of time, and photocuring was carried out at an exposure amount of about 1000 mJ/cm². Thereafter, heat curing at about 170° C. was carried out for 1 hour, and the copper foil was removed using an etching solution, thereby manufacturing a specimen for measurement.

Then, the electromagnetic wave shielding rate of the specimen was measured by the method according to ASTM D4935-10.

TABLE 3

| Results of Experiment Examples 1 to 3 | | | | | | |
|---|---|---|---|---|---|---|
| | Example 1 | Example 2 | Example 3 | Comparative Example 1 | Comparative Example 2 | Comparative Example 3 |
| Developability (sensitivity) | 1 | 1 | 1 | 1 | 1 | 2 |
| Tg | 1 | 1 | 1 | 1 | 1 | 1 |
| α1 | 1 | 1 | 1 | 3 | 3 | 2 |
| α2 | 2 | 1 | 1 | 3 | 3 | 2 |
| PCT thermal resistance | 1 | 1 | 1 | 1 | 1 | 1 |
| Plating resistance | 1 | 1 | 1 | 1 | 1 | 1 |
| Absorbance (%) | 0.7 | 0.8 | 0.7 | 0.5 | 0.6 | 0.7 |
| Pencil hardness | 7H | 7H | 8H | 4H | 6H | 7H |
| Insulation resistance ($*10^{11}$ Ω) | 3.2 | 9.0 | 8.5 | 23 | 26 | 30 |
| Thermal conductivity (W/mK) | 0.51 | 1.24 | 2.40 | 0.23 | 0.23 | 0.24 |
| Electromagnetic wave shielding rate (dB @ 1 GHz) | 4 | 12 | 16 | 0 | 0 | 0 |

As shown in the measurement and evaluation results of the Table 3, it was confirmed that the DFSR of the examples may have a low coefficient of thermal expansion and improved thermal resistance reliability, as well as developability, and retain magnetic and thermal conductivity properties, while simultaneously even imparting electrical insulation, thereby implementing an excellent thermal conducting property and electromagnetic wave absorption performance without lowering voltage resistance strength.

Specifically, it was confirmed that the DFSR of the examples had excellent developability and thermal resistance, while also having insulation resistance of $3*10^{11}\Omega$ or more, high thermal conductivity of 0.5 W/mK or more, and an electromagnetic wave shielding rate of 1 dB or more.

On the contrary, it was confirmed that the DFSR provided in the comparative examples had lower thermal resistance and developability than those of the examples, and particularly had low thermal conductivity together with relatively high insulation resistance, and was also difficult to substantially implement an electromagnetic shielding effect.

What is claimed is:

1. A photocurable and thermocurable resin composition, comprising:
   an acid-modified oligomer including an iminocarbonate-based compound containing a carboxyl group and a photocurable unsaturated functional group;
   a photopolymerizable monomer having two or more photocurable unsaturated functional groups;
   a thermocurable binder having a thermally curable functional group;
   a functional filler comprising carbon allotrope particles having a ceramic compound bound to a surface thereof, and optionally comprising heat radiating ceramic particles; and
   a photoinitiator.

2. The photocurable and thermocurable resin composition of claim 1,
   wherein the carbon allotrope particles include one or more selected from the group consisting of graphite, carbon nanotubes, graphene, and graphene oxide.

3. The photocurable and thermocurable resin composition of claim 1,
   wherein the carbon allotrope particles have a largest diameter of 0.1 μm to 5 μm.

4. The photocurable and thermocurable resin composition of claim 1,
   wherein the ceramic compound includes one or more selected from the group consisting of silica, alumina, boron nitride, aluminum nitride, silicon carbide, magnesium oxide, zinc oxide, and aluminum hydroxide.

5. The photocurable and thermocurable resin composition of claim 1,
   wherein the functional filler comprises heat radiating ceramic particles that include one or more selected from the group consisting of spherical alumina, boron nitride, ammonium nitride, silicon carbonate, and magnesium oxide.

6. The photocurable and thermocurable resin composition of claim 1,
   wherein the functional filler comprises heat radiating ceramic particles that have a largest diameter of 0.01 μm to 5 μm.

7. The photocurable and thermocurable resin composition of claim 1,
   wherein the functional filler includes the heat radiating ceramic particles in a weight ratio of 1 to 80 relative to the carbon allotrope particles having a ceramic compound bound to the surface thereof.

8. The photocurable and thermocurable resin composition of claim 1,
   wherein the functional filler is contained in an amount of 0.1 wt % to 70 wt %, based on a total weight of the resin composition.

9. The photocurable and thermocurable resin composition of claim 1,
   wherein the iminocarbonate-based compound is formed by reacting a cyanate ester-based compound with a dicarboxylic acid compound and a compound having a photocurable unsaturated functional group and a hydroxyl group or a carboxyl group.

10. The photocurable and thermocurable resin composition of claim 9,
    wherein the dicarboxylic acid compound includes an aliphatic dicarboxylic acid compound, an alicyclic dicarboxylic acid compound, or an aromatic dicarboxylic acid compound.

11. The photocurable and thermocurable resin composition of claim 10,
    wherein the aliphatic dicarboxylic acid compound includes one or more compounds selected from the group consisting of oxalic acid, malonic acid, succinic acid, glutaric acid, adipic acid, pimelic acid, suberic acid, azelaic acid, sebacic acid, norbornene dicarboxylic acid, tetrahydrophthalic acid, cycloalkane dicarboxylic acid having 5 to 10 carbon atoms, and acid anhydrides thereof.

12. The photocurable and thermocurable resin composition of claim 10,
    wherein the aromatic dicarboxylic acid compound includes one or more compounds selected from the group consisting of phthalic acid, imidazole dicarboxylic acid, pyridine dicarboxylic acid, and acid anhydrides thereof.

13. The photocurable and thermocurable resin composition of claim 9,
    wherein the compound having a photocurable unsaturated functional group and a hydroxyl group or a carboxyl group includes one or more compounds selected from the group consisting of acrylic acid, methacrylic acid, cinnamic acid, butenoic acid, hexenoic acid, 2-allylphenol, hydroxystyrene, hydroxycyclohexene, and hydroxy naphthoquinone.

14. The photocurable and thermocurable resin composition of claim 9,
    wherein the cyanate ester-based compound includes a bisphenol-based compound or a novolac-based compound having a cyanide group.

15. The photocurable and thermocurable resin composition of claim 9,
    wherein the dicarboxylic acid compound and the compound having a photocurable unsaturated functional group and a hydroxyl group or a carboxyl group are used in a mole ratio of 2:8 to 8:2, thereby being reacted with the cyanate ester-based compound.

16. The photocurable and thermocurable resin composition of claim 1,
    wherein the acid-modified oligomer includes an iminocarbonate-based compound of following Chemical Formula 1:

[Chemical Formula 1]

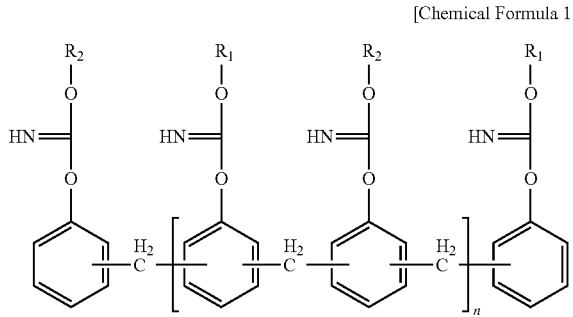

wherein n is an integer of 1 to 100; $R_1$ is a functional group derived from a compound having a photocurable unsaturated functional group and a hydroxyl group or a carboxyl group; and $R_2$ is a functional group derived from a dicarboxylic acid compound.

17. The photocurable and thermocurable resin composition of claim 16,
wherein in Chemical Formula 1,
$R_1$ is

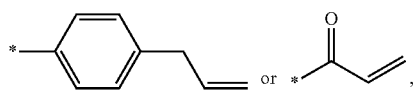

$R_2$ is

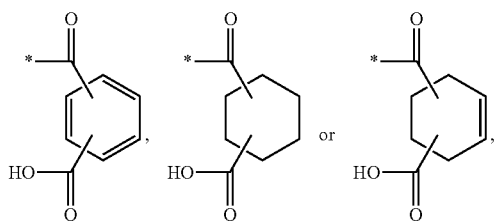

and wherein * refers to a bonding point.

18. The photocurable and thermocurable resin composition of claim 1,
wherein the acid-modified oligomer is contained in an amount of 15 wt % to 75 wt %, based on a total weight of the resin composition.

19. The photocurable and thermocurable resin composition of claim 1,
wherein the photopolymerizable monomer includes an acrylate-based compound having two or more photocurable unsaturated functional groups.

20. The photocurable and thermocurable resin composition of claim 1,
wherein the photoinitiator includes one or more selected from the group consisting of benzoin and its alkyl ethers, acetophenones, anthraquinones, thioxanthones, ketals, benzophenones, α-aminoacetophenones, acylphosphine oxides, and oxime esters.

21. The photocurable and thermocurable resin composition of claim 1,
wherein the photoinitiator is contained in an amount of 0.5 wt % to 20 wt %, based on the total weight of the resin composition.

22. The photocurable and thermocurable resin composition of claim 1,
wherein the thermally curable functional group is one or more selected from the group consisting of an epoxy group, an oxetanyl group, a cyclic ether group, and a cyclic thioether group.

23. The photocurable and thermocurable resin composition of claim 1,
wherein the thermocurable binder is contained in a content corresponding to 0.8 to 2.0 equivalents relative to 1 equivalent of the carboxyl group of the acid-modified oligomer.

* * * * *